US012696420B2

(12) United States Patent
Geng et al.

(10) Patent No.: US 12,696,420 B2
(45) Date of Patent: Jul. 28, 2026

(54) FASTENING DEVICE FOR FASTENING AN ELECTRONIC COMPONENT

(71) Applicant: PATCHBOX GMBH, Vienna (AT)

(72) Inventors: Alexander Geng, Vienna (AT); Josef Hofstätter, Vienna (AT)

(73) Assignee: PATCHBOX GMBH, Vienna (AT)

( * ) Notice: Subject to any disclaimer, the term of this patent is extended or adjusted under 35 U.S.C. 154(b) by 0 days.

(21) Appl. No.: 19/144,151

(22) PCT Filed: Dec. 7, 2023

(86) PCT No.: PCT/IB2023/062355
§ 371 (c)(1),
(2) Date: Jun. 27, 2025

(87) PCT Pub. No.: WO2024/141836
PCT Pub. Date: Jul. 4, 2024

(65) Prior Publication Data
US 2026/0122826 A1 Apr. 30, 2026

(30) Foreign Application Priority Data

Dec. 27, 2022 (AT) .................................. A 234/2022

(51) Int. Cl.
*H05K 7/14* (2006.01)
(52) U.S. Cl.
CPC .................................. *H05K 7/1489* (2013.01)
(58) Field of Classification Search
CPC ...... H05K 7/14; H05K 7/1415; H05K 7/1485; H05K 7/1488; H05K 7/18; H05K 7/183

USPC ..................................................... 361/724–728
See application file for complete search history.

(56) References Cited

U.S. PATENT DOCUMENTS

| | | | | |
|---|---|---|---|---|
| 5,510,955 A * | 4/1996 | Taesang | ............... | G11B 33/124 |
| 6,095,345 A | 8/2000 | Gibbons | | |
| 6,469,899 B2 * | 10/2002 | Hastings | ............. | H05K 7/1489 |
| | | | | 248/65 |
| 6,695,149 B1 * | 2/2004 | Cote | ...................... | H05K 7/183 |
| | | | | 403/397 |

(Continued)

FOREIGN PATENT DOCUMENTS

| | | | | |
|---|---|---|---|---|
| AU | 2024322214 A1 * | 2/2026 | ........... | H05K 7/1489 |
| DE | 202011051025 U1 | 11/2011 | | |

(Continued)

OTHER PUBLICATIONS

International Search Report and Written Opinion received in PCT/IB2023/062355 dated Mar. 14, 2024, 17 pages.

(Continued)

*Primary Examiner* — Adrian S Wilson
(74) *Attorney, Agent, or Firm* — Liang & Hennessey LLP; Brian Hennessey

(57) ABSTRACT

A fastening device for fastening an electronic component, which has at least one fastening tab with at least one hole, to a sheet-metal angled rail of a rack having a row of holes, including a plate which can be placed on a side wall of the component and can optionally be connected thereto, the plate having a fastening section bent along a bending line, the fastening section having at least one first fastening bolt that extends away from the plate and can be inserted into the hole of the fastening tab and optionally into the row of holes.

20 Claims, 6 Drawing Sheets

(56)            References Cited

U.S. PATENT DOCUMENTS

| 6,891,727 | B2 * | 5/2005 | Dittus | H05K 7/1489 |
| | | | | 312/334.5 |
| 6,974,037 | B2 * | 12/2005 | Haney | A47B 88/43 |
| | | | | 211/183 |
| 8,727,138 | B2 * | 5/2014 | Dittus | H05K 7/183 |
| | | | | 312/334.4 |
| 8,936,163 | B2 * | 1/2015 | Fleischer | H05K 5/0204 |
| | | | | 211/186 |
| 9,125,489 | B2 * | 9/2015 | Chen | A47B 88/43 |
| 9,854,699 | B2 * | 12/2017 | Geng | G02B 6/4453 |
| 10,813,242 | B2 * | 10/2020 | Geng | H05K 7/16 |
| D1,018,267 | S * | 3/2024 | Geng | D8/382 |
| 2004/0104184 | A1 * | 6/2004 | Hartman | G06F 1/183 |
| | | | | 211/192 |
| 2006/0274508 | A1 * | 12/2006 | LaRiviere | H05K 7/1488 |
| | | | | 361/727 |
| 2009/0101603 | A1 | 4/2009 | Hilburn et al. | |
| 2012/0104200 | A1 | 5/2012 | Grady, IV et al. | |
| 2012/0153104 | A1 | 6/2012 | Yu et al. | |
| 2012/0193489 | A1 | 8/2012 | Yu et al. | |
| 2013/0112638 | A1 * | 5/2013 | Dittus | H05K 7/183 |
| | | | | 211/123 |
| 2014/0111070 | A1 * | 4/2014 | Ehlen | H05K 7/14 |
| | | | | 29/525.01 |
| 2018/0084908 | A1 | 3/2018 | Chen et al. | |
| 2019/0390701 | A1 * | 12/2019 | Geng | F16B 12/10 |
| 2020/0146173 | A1 | 5/2020 | Hsu | |

FOREIGN PATENT DOCUMENTS

| DE | 202014100424 | U1 | 2/2014 | | |
| EP | 3751971 | A1 | 12/2020 | | |
| EP | 3833168 | A1 | 6/2021 | | |
| GB | 2483756 | A * | 3/2012 | | H05K 7/1489 |
| WO | WO-2020052879 | A1 * | 3/2020 | | E01B 27/16 |
| WO | WO-2025030197 | A1 * | 2/2025 | | H05K 7/1489 |

OTHER PUBLICATIONS

Austrian Office Action received in Application No. .A 234/2022-1 dated Aug. 7, 2023, 3 pages.

* cited by examiner

FASTENING DEVICE FOR FASTENING AN ELECTRONIC COMPONENT

CROSS-REFERENCE TO RELATED APPLICATIONS

The present application is a national phase application of PCT Application No. PCT/IB2023/062355, filed Dec. 7, 2023, entitled "FASTENING DEVICE FOR FASTENING AN ELECTRONIC COMPONENT", which claims the benefit of Austrian Patent Application No. A 234/2022, filed Dec. 27, 2022, each of which is incorporated by reference in its entirety.

BACKGROUND OF THE INVENTION

1. Field of the Invention

The invention relates to a fastening device for fastening an electronic component, which has at least one fastening tab with at least one hole, to a sheet-metal angled rail of a rack having a row of holes.

The invention further relates to a rack for storing electronic components, comprising at least two spaced-apart, vertically extending sheet-metal angled rails having a row of holes, the mutually facing first legs of which delimit an opening and to which at least one electronic component is fastened, wherein one fastening device according to the invention is fastened to the first leg.

2. Description of the Related Art

In connection with the present invention and in accordance with technical usage, the term rack is understood to mean a rack for electronic components with a standardized width of, for example, 19 inches, in which the individual components that can be mounted in the rack have a width of, for example, 19 inches that corresponds to the standardized width. In the height direction, such a rack is usually subdivided into standardized rack units, which in turn determines the minimum height of a component to be mounted. Accordingly, the electronic components to be fastened in the rack usually have a standardized height of one rack unit or a multiple thereof. A rack unit of a standard 19 inch rack has a height of 1.75 inches.

The electronic components to be fastened with the fastening device have laterally protruding plate-shaped fastening tabs, by means of which sheet-metal angled rails running on the front side of the rack are fastened to the rows of holes. The plate-shaped fastening tabs of the electronic component are provided with holes in their laterally protruding areas, which serve to receive connecting means, in particular screw bolts, in a position aligned with the row of holes of the sheet-metal angled rails. The sheet-metal angled rails can be about 2 mm thick and, in the case of standard 19-inch racks, are each 15.88 mm wide and form an approximately 19-inch wide opening between them. For each rack unit, there are usually three holes at intervals of 0.655 inches one above the other.

The fastening of electronic components in racks is complex and usually difficult, since the electronic components have a certain weight and a certain bulkiness.

Electronic components are usually fastened on the front side of the rack, i.e. where the vertically extending sheet-metal angled rails provided with the row of holes are arranged.

The holes of the row of holes can be formed as round holes in so-called "round-hole racks" or as square holes in so-called "square-hole racks" or are provided with threads in so-called "threaded-hole racks".

Since racks of the conventional type do not provide a support surface for mounting the electronic components, the installer must manually bring the electronic component into a position in which the holes on the laterally protruding areas of the plate-shaped fastening tabs are aligned with the holes of the row of holes of the sheet-metal angled rails, hold the component in this position and attach the connecting screws to fix the component in the rack. The installer must either hold the electronic component in the correct position himself, so that only one free hand is available for fastening the component, or the assembly must be carried out by two people, one of the parties holding the component in the correct mounting position and the other carrying out the fastening.

Alternatively, electronic components may also be mounted on the back of the rack, which is usually also provided with rows of holes.

Due to the above-mentioned shortcomings, the mounting of electronic components in racks is time-consuming and requires a high level of personnel.

SUMMARY OF THE INVENTION

The present invention therefore aims to provide a fastening device with which the aforementioned disadvantages can be overcome.

To achieve the object according to the invention, the invention provides a fastening device for fastening an electronic component, which has at least one fastening tab with at least one hole, to a sheet-metal angled rail of a rack having a row of holes, the fastening device comprising a plate which can be placed on a side wall of the component and can optionally be connected thereto, the plate having a fastening section bent along a bending line, the fastening section having at least one first fastening bolt that extends away from the plate and can be inserted into the hole of the fastening tab and optionally into the row of holes.

According to the invention, it is accordingly provided that the plate of the fastening device faces the side wall of the electronic component and the at least one first fastening bolt of the fastening section passes through the fastening tab of the electronic component and optionally the row of holes, which allows the electronic component to be supported and an associated simplified assembly. In this case, one or preferably two fastening devices may be fastened in advance to the respective sheet-metal angled rail or hooked into it, and the electronic component can then be supported on the fastening device(s), so that a supported position of the components is already ensured for the subsequent assembly of screws or the like. It is therefore no longer necessary to support the component manually at the same time for its assembly and to fasten it to the sheet-metal angled rails.

Preferably, the at least one first fastening bolt is designed as a threaded bolt.

Since the row of holes of the rack runs vertically, it is preferably provided that the fastening section of the fastening device runs at a right angle to the plate. This ensures that the fastening section rests flat against the row of holes of the rack.

The fastening device according to the invention is preferably further developed in such a way that the fastening section has two first fastening bolts which extend away from the plate and can each be inserted into a hole in the fastening tab and optionally into the row of holes.

The provision of two bolts enables a more stable fixing of the electronic component in the rack compared to an embodiment with only one bolt, since the two bolts of the fastening section engage in two holes-instead of only one hole—of the row of holes of the rack. The dead weight of the electronic component exerts a tilting moment on the fastening bolts, which, with a suitable design, leads to the first fastening bolts becoming wedged in the holes of the row of holes in the rack, so that the electronic component is secured against falling down even without further connecting elements on the rack.

In order to make the fastening device according to the invention usable also in the case of so-called "threaded-hole racks", i.e. in the case of racks with holes having threads, it is preferably provided that the fastening section has a through-hole for a screw bolt connecting the fastening section to the row of holes.

Furthermore, in the case of this preferred embodiment, it is preferably provided that the fastening section has at least one second fastening bolt extending away from the plate and facing away from the at least one first fastening bolt.

If the above-described preferred embodiment of the fastening device according to the invention is fastened to a row of holes in a rack, the second fastening bolt passes through a hole in the row of holes from the front, i.e. from the outside of the rack, and thus ensures the desired fixing and support of the electronic component placed on the first fastening bolts.

It is preferably provided that the fastening section has two second fastening bolts, which extend away from the plate and can each be inserted into a hole in the row of holes and between which the through-hole is arranged.

In order to securely support the electronic component on the fastening devices, it can preferably be provided that the plate has a positive-locking element which acts in the direction of the bending line and can be brought into positive-locking engagement with the component in order to support the component against gravity.

The phrase "effective in the direction of the bending line" is to be understood here as meaning that the component is accommodated in the rack in such a way that it cannot move in the direction of the floor on which the rack stands, i.e. is protected against falling or sagging.

In an advantageous manner, the fastening device according to the invention is further developed in such a way that the plate is formed with a long and a short side, in particular rectangular, wherein the fastening section is bent along the short side and a holding section forming the positive-locking element is bent along the long side, on which the component can be supported, wherein the holding section is preferably bent starting from the plate plane in a direction opposite to the fastening section.

According to this preferred embodiment, the side regions of the electronic component rest with their underside in a positive-locking manner on the respective holding section, whereby a stable support of the component within the rack is made possible and the assembly of the component is significantly facilitated.

A sagging of heavy electronic components in a rack unit lying below the fastening plane can thus be effectively prevented both during the assembly process and afterwards.

A further advantage of this preferred embodiment is that electronic components that do not have a separate device for fastening on the front and optional rear 19-inch sheet-metal angled rails of the rack, such as a server with only laterally fastened server rails, can be fastened in a space-saving manner.

According to an alternative embodiment, it is preferably provided that the positive-locking element is formed by an end region of the plate which is bent in a hook-like manner.

This alternative embodiment also provides a stable fastening option for electronic components in racks, by means of which sagging is prevented and assembly is significantly simplified.

The invention further relates to a rack for storing electronic components, comprising at least two spaced-apart, vertically extending sheet-metal angled rails having a row of holes, the mutually facing first legs of which delimit an opening and to which at least one electronic component is fastened, wherein the electronic component essentially has a width corresponding to the opening and at least two fastening tabs which project outwards at a front side at their edges, are preferably aligned with the front side, are arranged adjacent to the first legs and have holes aligned with holes of the row of holes, and wherein one above-explained fastening device is fastened to each of the first legs, the first fastening bolts of the fastening device penetrating the holes of the fastening tab and optionally into the row of holes and on which the component is supported in a positive-locking manner against gravity.

In this case, the first leg of the respective sheet-metal angled rail of the rack is the leg to which the fastening tabs of the electronic components are fastened and which generally lie in a common front plane.

The fastening tabs of the component lie on the front side, i.e. the side facing away from the interior of the rack, of the row of holes and can thus be held by the first fastening bolts, which are arranged on the fastening device and penetrate the holes from the rear, as a result of which the component is fixed to the rack.

The rack is preferably formed in such a way that the fastening section of the fastening device is arranged on the inside of the sheet-metal angled rail of the rack on the first leg.

This arrangement is selected when the fastening device is used on so-called "round-hole" or "square-hole" racks, i.e. racks with round or square holes.

Alternatively, it can be provided that the fastening section is arranged on the outside of the sheet-metal angled rail on the first leg.

This arrangement is used when the fastening device is fastened to so-called "threaded-hole racks", i.e. racks with threaded holes.

In the case of fixing to a "threaded-hole rack", it is preferably provided that the second fastening bolts penetrate holes of the row of holes, wherein the through-hole arranged between the second fastening bolts is arranged in alignment with a hole of the row of holes and is penetrated by a screw bolt connecting the fastening section to the row of holes.

The screw bolt achieves the desired locking and fixing of the electronic component in the rack.

In order to enable the most extensive surface support possible, it is particularly preferably provided that the component rests on the holding section.

Alternatively, it can be provided that the end region, which is bent in a hook-like manner, engages in a slot-shaped recess of the component, thereby ensuring a stable positive-locking connection between the end region and the recess.

The rack particularly preferably has four sheet-metal angled rails delimiting a cuboid-shaped storage space, and the fastening devices do not form a continuous connection between two adjacent sheet-metal angled rails.

In each case, two of the four sheet-metal angled rails delimiting the cuboid-shaped storage space form the front and the rear of the rack.

According to this preferred embodiment, the fastening device fastened to the front or rear side of the row of holes protrudes into the interior of the cuboid-shaped storage space, i.e. extends in the direction of a second leg of the sheet-metal angled rail of the rack.

In this case, the end of the fastening device having the at least one first fastening bolt is arranged on the front or rear side of the row of holes, and the fastening bolt passes through a hole in the fastening tab from the rear (in the case of the embodiment arranged on the front side) and a hole in the fastening tab and in the row of holes from the rear (in the case of the embodiment arranged on the rear side).

This enables a stable fastening of an electronic component in a rack without the need for a connection between two adjacent sheet-metal angled rails, as provided for in the prior art.

BRIEF DESCRIPTION OF THE DRAWINGS

The invention is explained in more detail below with reference to exemplary embodiments schematically illustrated in the drawing. Therein.

DETAILED DESCRIPTION

Figure 1:
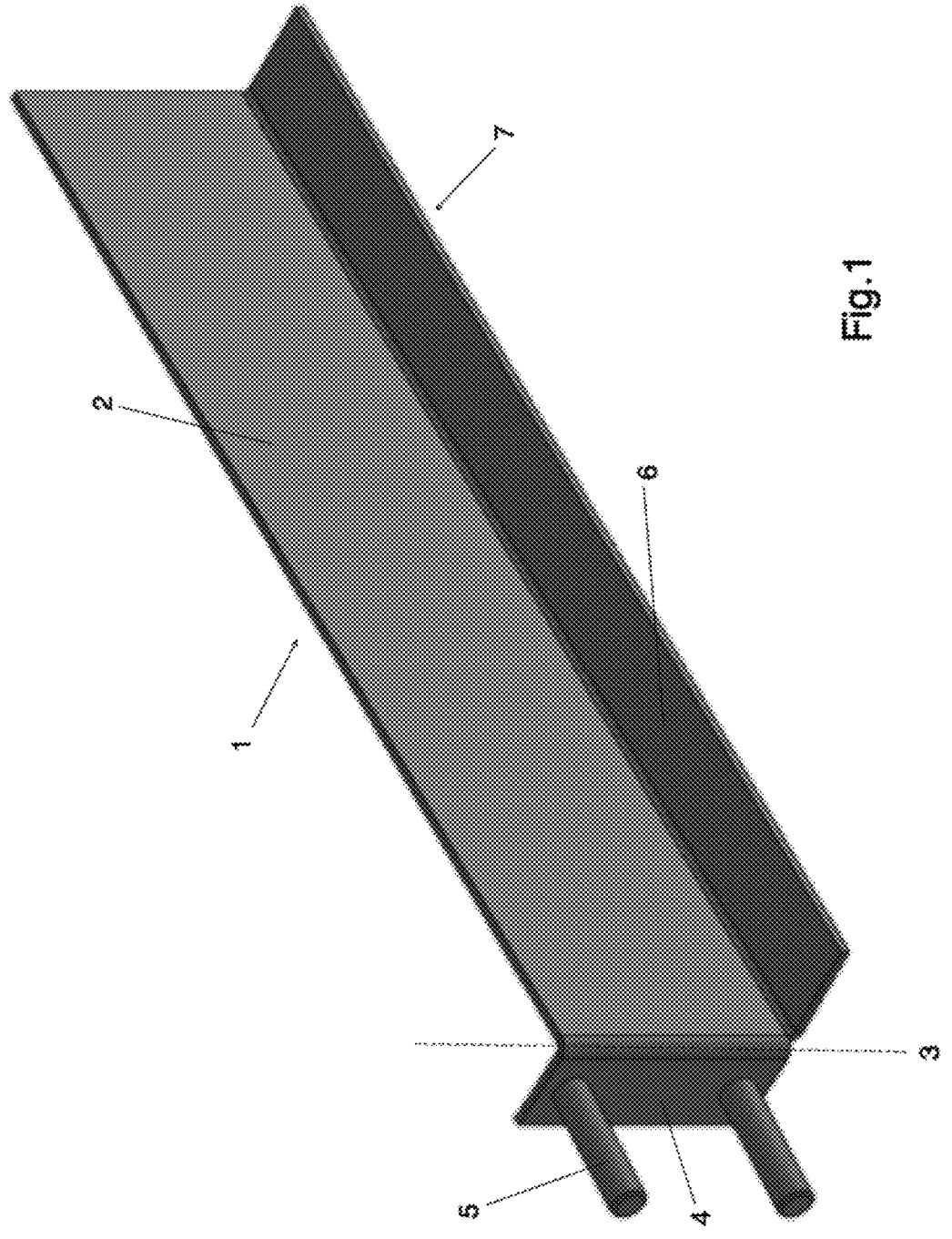
FIG. 1 shows a first embodiment of the fastening device according to the invention.

In FIG. 1, the fastening device is denoted by 1. The fastening device 1 comprises a plate 2 which has a fastening section 4 which is bent along a bending line 3 and has two first fastening bolts 5 which extend away from the plate 2. The fastening section 4 extends at a right angle to the plate 2.

The plate 2 has a positive-locking element 6, which acts in the direction of the bending line 3 and on which an electronic component (not shown in FIG. 1) can be placed in order to support the component against gravity.

The plate 2 has a long side and a short side and is formed to be rectangular, wherein the fastening section 4 is bent along the short side and a holding section 7 forming the positive-locking element 6 is bent along the long side. Starting from the plate plane, the holding section 7 is bent at a right angle in a direction opposite to the fastening section 4.

Figure 2:
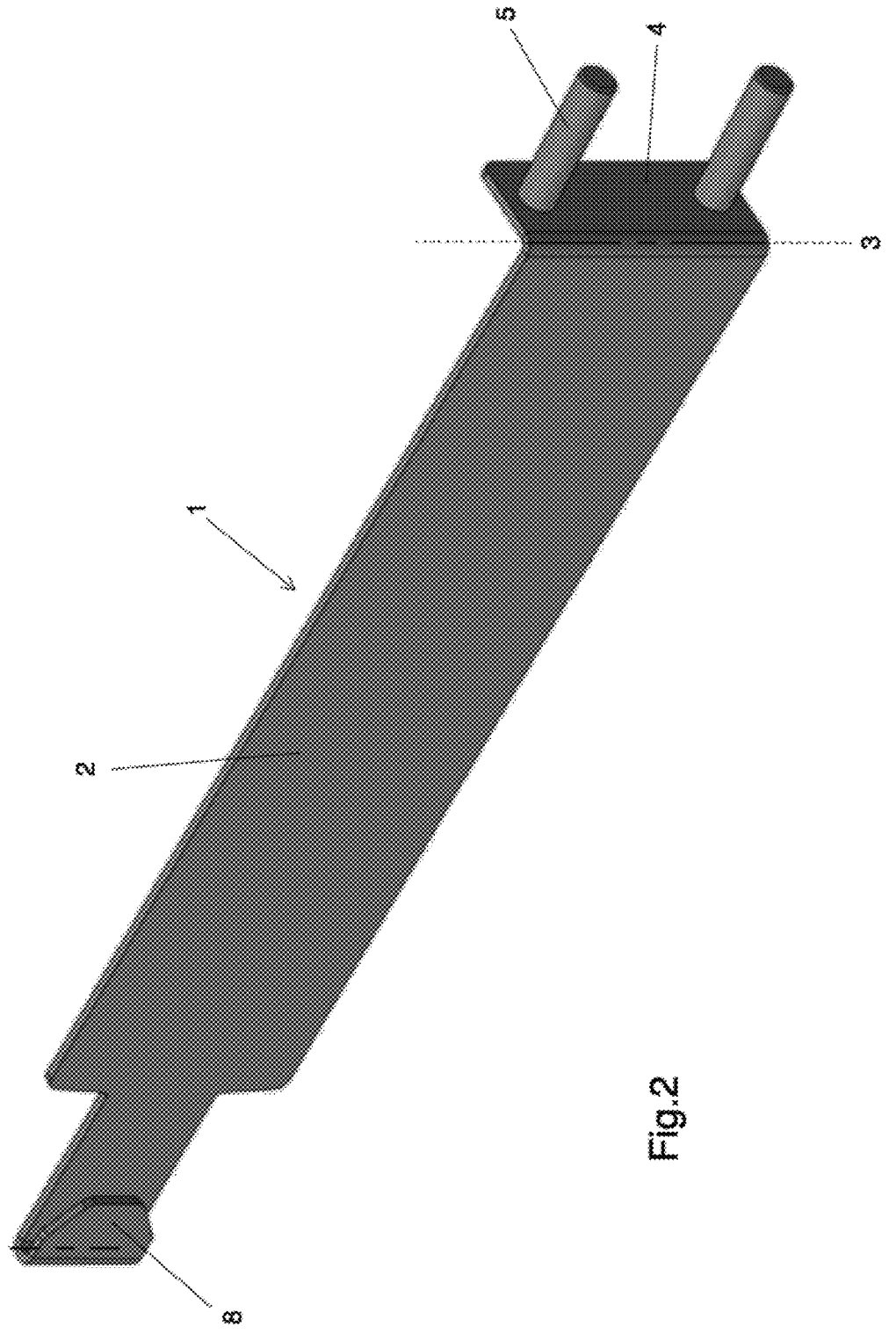
FIG. 2 shows a second embodiment of the fastening device according to the invention.

FIG. 2 shows a second embodiment of the invention, wherein the same parts are provided with the same reference numerals as in FIG. 1.

In contrast to the embodiment shown in FIG. 1, the positive-locking element 6 shown in FIG. 1 is formed in FIG. 2 by an end region 8 of the plate 2, which is bent in a hook-like manner.

Figure 3:
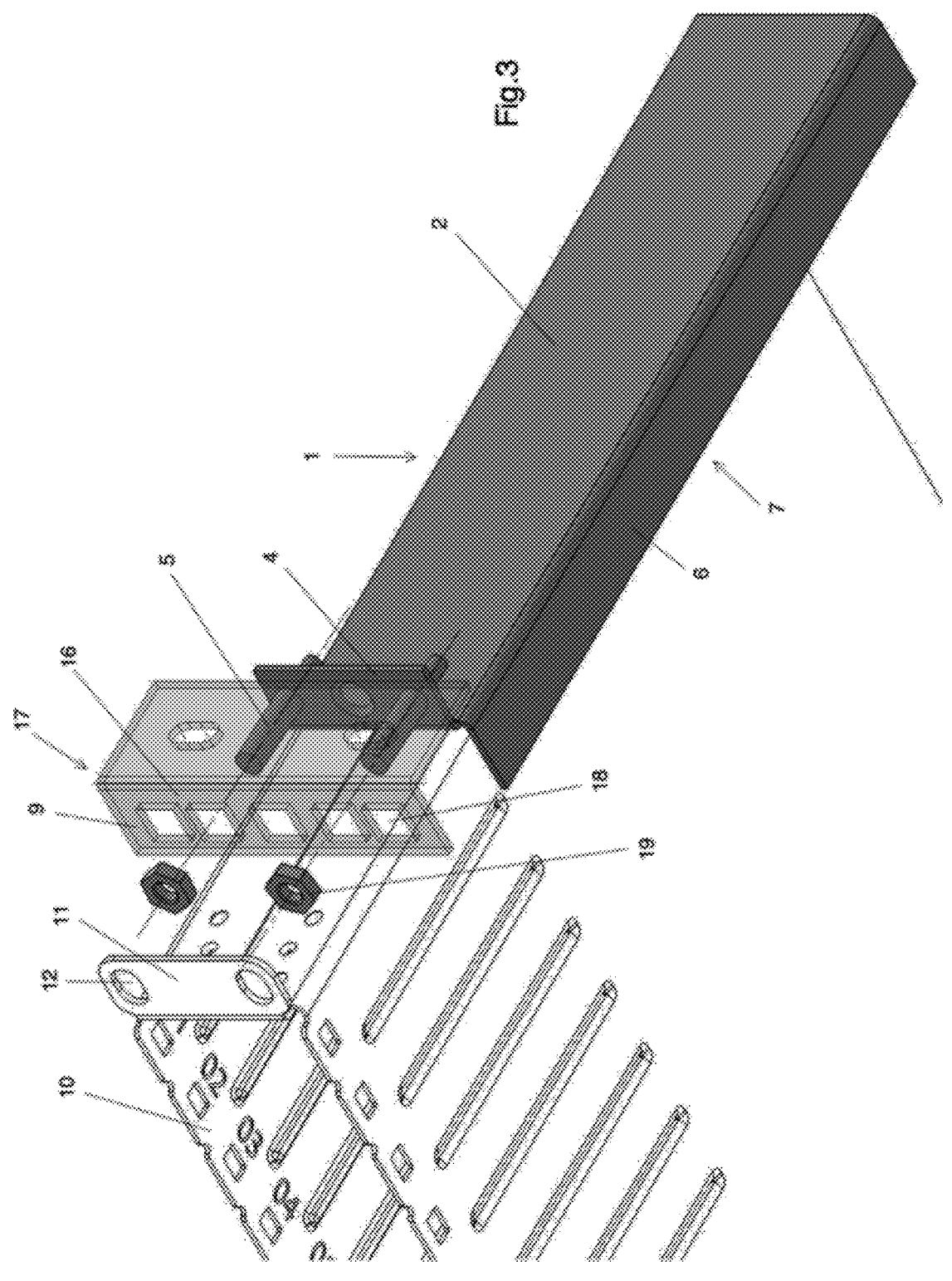
FIG. 3 shows the attachment of the first embodiment in combination with an electronic component to the row of holes of a rack.

FIG. 3 shows the first embodiment of the fastening device 1 according to the invention shown in FIG. 1 in combination with a row of holes 9 on a first leg 16 of a sheet-metal angled rail 17 of a rack and an electronic component 10 to be fastened to the rack.

The electronic component 10 is equipped on both sides with fastening tabs 11, each having two holes 12, which, in the assembled state, are aligned with the holes 18 of the front side of the row of holes 9 of the rack.

If the electronic component 10 is fastened to the row of holes 9, the first fastening bolts 5 of the fastening device 1 penetrate both the holes 12 of the fastening tab 11 and the holes 18 of the row of holes 9, the first leg 16 being clamped between the fastening tab 11 and the fastening section 4 of the device 1 by tightening the nuts 19 screwed onto a thread on the first fastening bolts 5. In this case, the electronic component 10 rests on the holding section 7. This ensures that the component 10 is supported in a positive-locking manner against gravity and is securely fastened in the rack.

Figure 4:
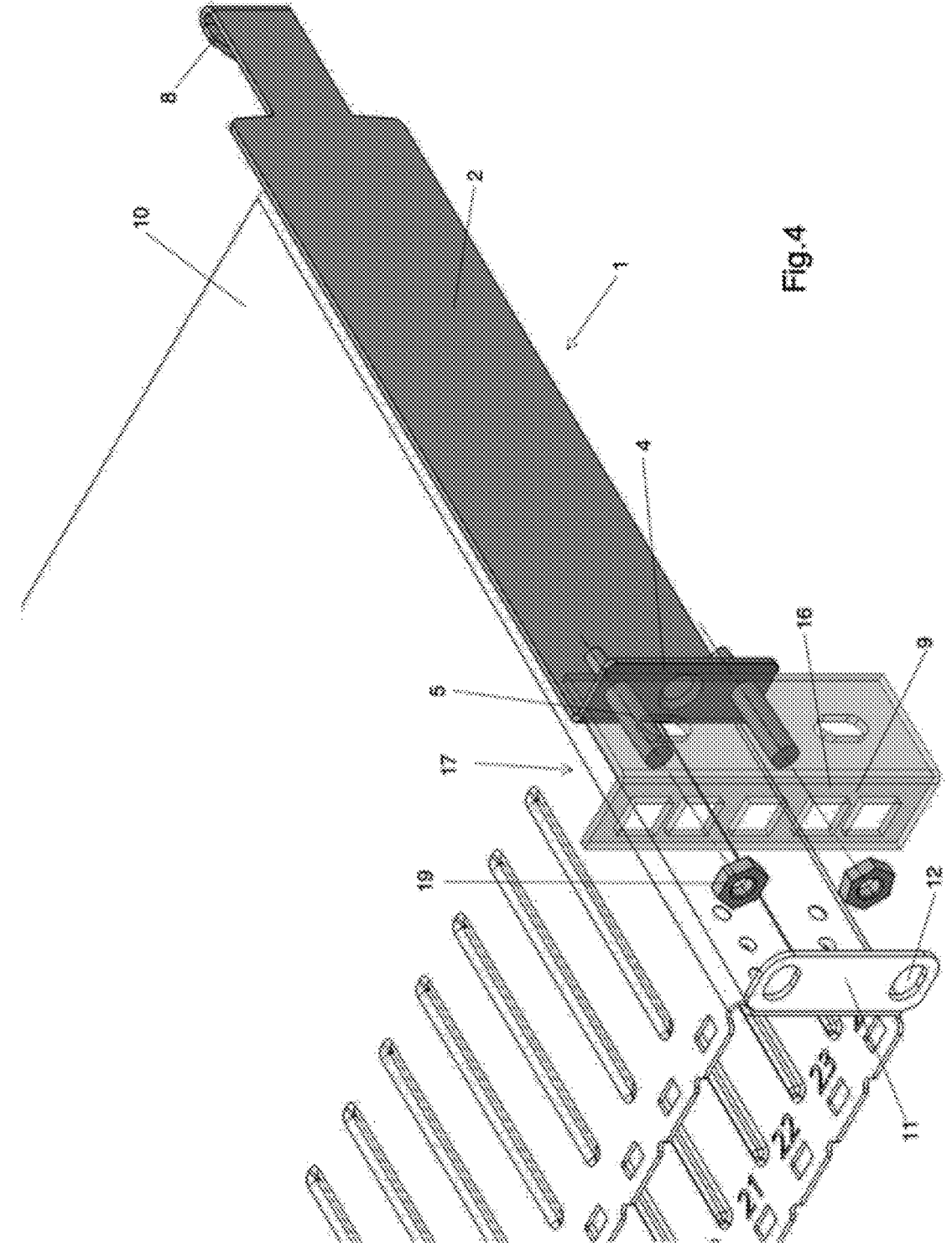
FIG. 4 shows the attachment of the second embodiment in combination with an electronic component to the row of holes of a rack.

FIG. 4 shows the second embodiment of the fastening device 1 according to the invention shown in FIG. 2 in combination with a row of holes 9 of a rack and an electronic component 10 to be fastened in the rack.

In contrast to the first embodiment, the electronic component 10 is supported by latching into an end region 8 of the plate 2, which is bent in a hook-like manner.

In this case, the electronic component 10 has a counterpart that fits the bent end region 8, e.g. a slot-shaped recess, in which the end region 8 engages.

Figure 5:
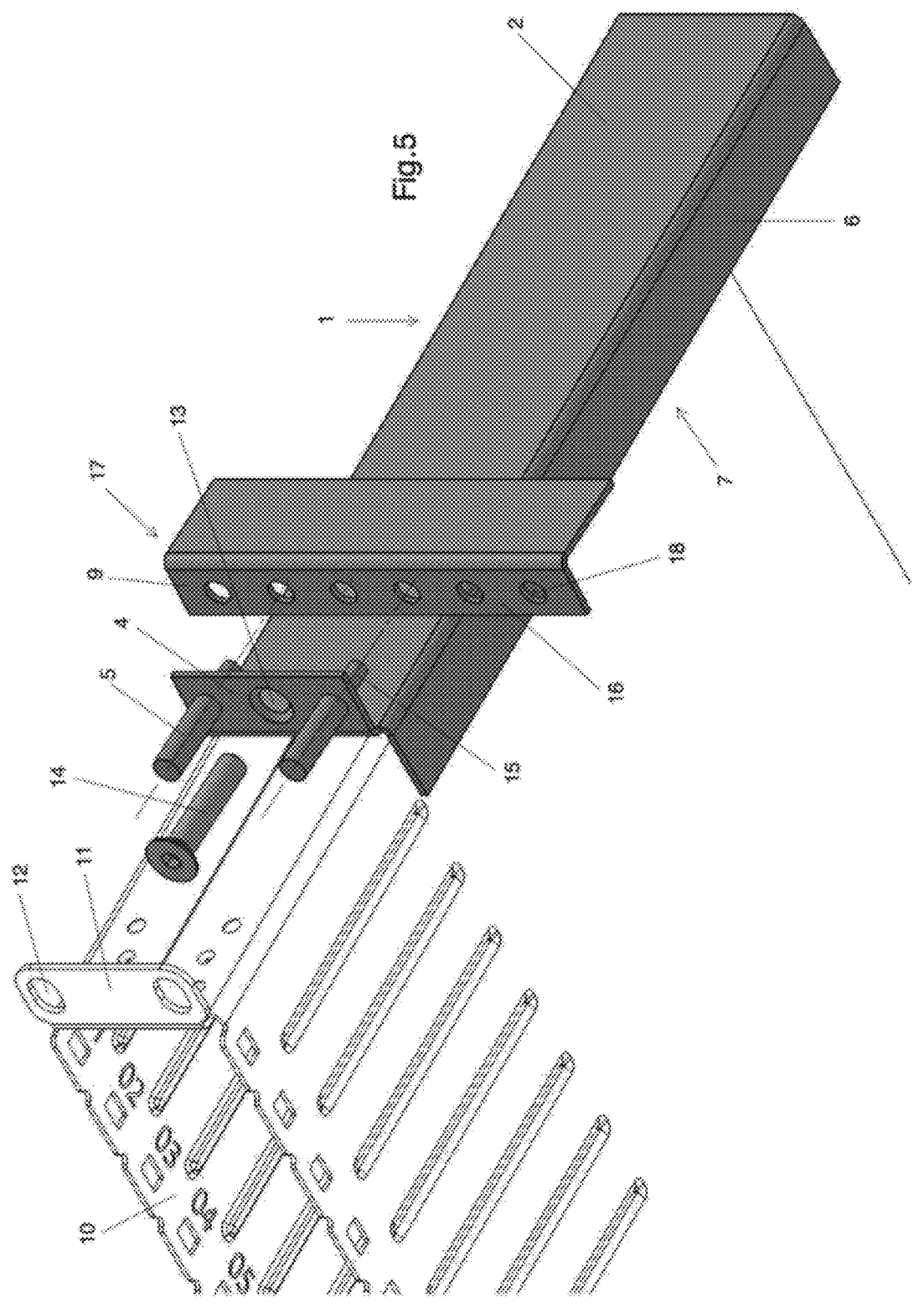
FIG. 5 shows a modified embodiment of the attachment of the first embodiment in combination with an electronic component to the row of holes of a rack.

FIG. 5 shows a modified embodiment of the fastening of the fastening device 1 according to the invention to the row of holes 9 of a rack. In the case of this embodiment, the rack in which the electronic component 10 is to be fastened is a so-called "threaded-hole rack".

In this case, the fastening section 4 is provided with a through-hole 13, through which a screw bolt 14 is screwed when the fastening section 4 is to be connected to the row of holes 9 of the rack.

Furthermore, in the case of this preferred embodiment, it is provided that the fastening section 4 has two second fastening bolts 15 extending away from the plate and facing away from the two first fastening bolts 5.

When fastened to the row of holes 9, the second fastening bolts 15 of the fastening device 1 penetrate the holes 18 of the row of holes 9 from the front, i.e. from the outside of the rack, and thus provide the desired support for the fastening device 1, as well as the fastening tab 11 of the electronic component 10, which is likewise placed on the first fastening bolts 5 from the front. The first fastening bolts 5 pass through the holes 12 of the fastening tab 11, and the fastening section 4 is arranged between the fastening tab 11 and the row of holes 9.

By tightening the screw bolt 14 located in the through-hole 13 of the fastening section 4, the fastening device 1 is fixed to the row of holes 9. The electronic component 10 mounted from the front on the first fastening bolts 5 is fixed to the fastening device 1 and the row of holes 9 by tightening nuts 19, which are not shown in FIG. 5 and can be screwed onto a thread on the first fastening bolts 5.

Analogous to the embodiment shown in FIG. 1 and FIG. 3, the electronic component 10 is supported by means of the positive-locking element 6, on which the component 10 rests.

Figure 6:
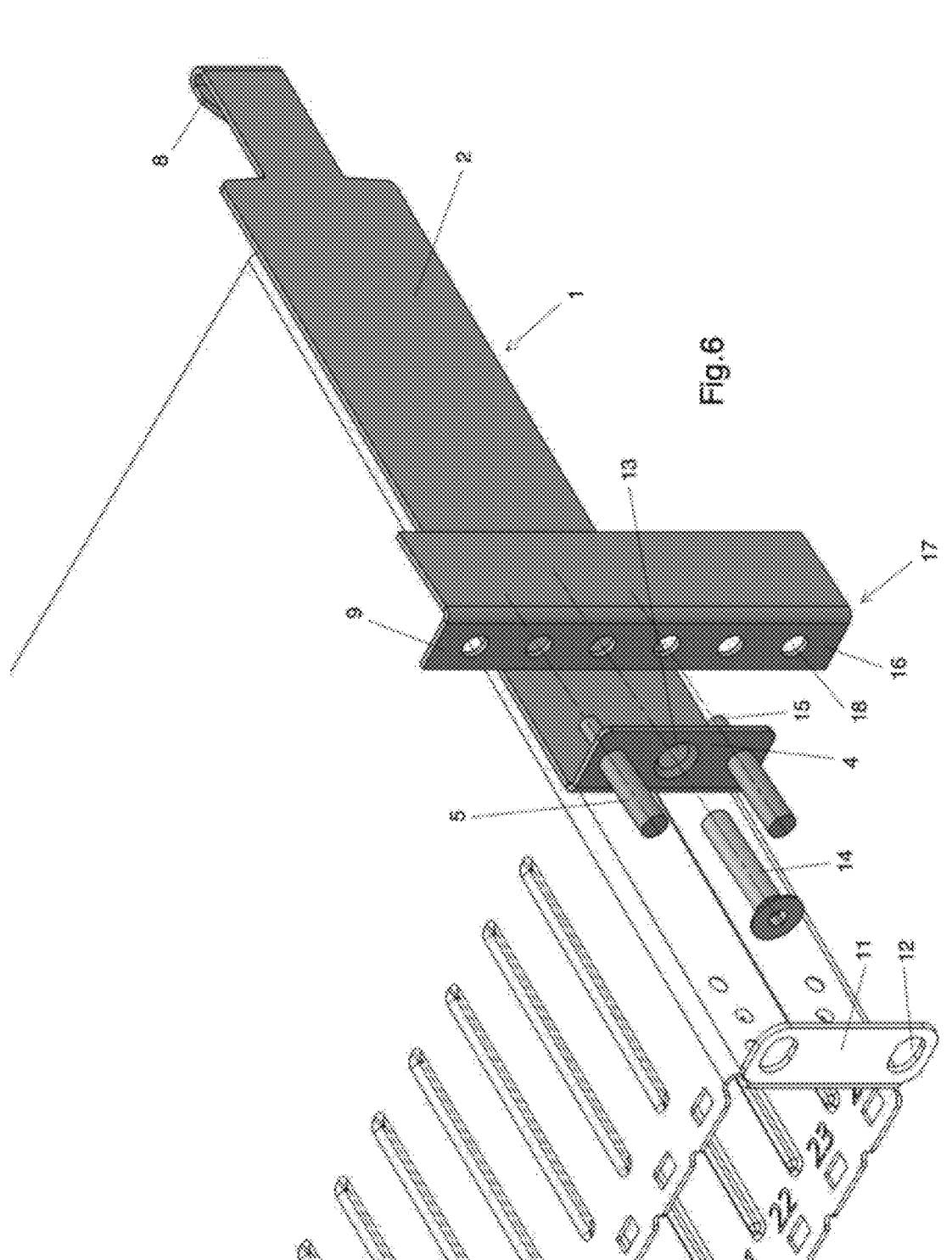
FIG. 6 shows a modified embodiment of the attachment of the second embodiment in combination with an electronic component.

FIG. 6 shows the fastening according to FIG. 5 in the case of the fastening device 1 according to the invention according to FIG. 2.

Analogous to the embodiment according to FIG. 4, the electronic component 10 is supported by latching into an end region 8 of the plate 2, which is bent in a hook-like manner.

The invention claimed is:

1. A rack for storing electronic components, comprising:

at least two spaced-apart, vertically extending sheet-metal angled rails having a row of holes, the mutually facing first legs of which delimit an opening and to which at least one electronic component is fastened;

wherein the electronic component has a width substantially corresponding to the opening and at least two fastening tabs which project outwards at a front side at their edges are arranged adjacent to the first legs, and have holes aligned with holes of the row of holes; and wherein a fastening device is fastened to the first legs, the fastening device including a plate configured to be placed on a side wall of the component, the plate having a fastening section bent along a bending line, the fastening section having at least one first fastening bolt that extends away from the plate and penetrates the hole of the fastening tab;

wherein the component is supported in a positive-locking manner against gravity on the fastening devices; and wherein the plate has a positive-locking element which acts in a direction of the bending line and can be brought into positive-locking engagement with the component in order to support the component against gravity.

2. The rack according to claim 1, wherein the at least two fastening tabs are aligned with the front side.

3. The rack according to claim 1, wherein the plate is connected to the side wall of the component.

4. The rack according to claim 1, wherein the at least one first fastening bolt penetrates the row of holes.

5. The rack according to claim 1, wherein the fastening section extends at a right angle to the plate.

6. The rack according to claim 1, wherein the fastening section has two first fastening bolts which extend away from the plate and are configured to each penetrate a hole in the fastening tab.

7. The rack according to claim 6, wherein the two first fastening bolts are configured to each penetrate the row of holes.

8. The rack according to claim 1, wherein the fastening section has a through-hole for a screw bolt connecting the fastening section to the row of holes.

9. The rack according to claim 8, wherein the fastening section has at least one second fastening bolt extending away from the plate and across from the at least one first fastening bolt.

10. The rack according to claim 9, wherein the fastening section has two second fastening bolts, which extend away from the plate and are configured to each be inserted into a hole in the row of holes and between which the through-hole is arranged.

11. The rack according to claim 1, wherein:

the plate is formed with a long and a short side; and the fastening section is bent along the short side and a holding section forming the positive-locking element is bent along the long side, on which the component are configured to be supported.

12. The rack according to claim 11, wherein the plate is rectangular.

13. The rack according to claim 11, wherein the holding section is bent starting from the plate plane in a direction opposite to the fastening section.

14. The rack according to claim 1, wherein the positive-locking element is formed by an end region of the plate which is bent in a hook-like manner.

15. The rack according to claim 1, wherein the fastening section is arranged on an inside of the sheet-metal angled rail on the first leg.

16. The rack according to claim 1, wherein the fastening section is arranged on the outside of the sheet-metal angled rail on the first leg.

17. The rack according to claim 9, wherein the second fastening bolts penetrate holes of the row of holes, wherein the through-hole arranged between the second fastening bolts is arranged in alignment with a hole of the row of holes and is penetrated by a screw bolt connecting the fastening section to the row of holes.

18. The rack according to claim 11, wherein the component rests on the holding section.

19. The rack according to claim 14, wherein the end region, which is bent in a hook-like manner, engages in a slot-shaped recess of the component.

20. The rack according to claim 1, wherein the rack has four sheet-metal angled rails delimiting a cuboid-shaped storage space, and the fastening devices do not form a continuous connection between two adjacent sheet-metal angled rails.

* * * * *